(12) United States Patent
Ruan et al.

(10) Patent No.: US 11,269,011 B2
(45) Date of Patent: Mar. 8, 2022

(54) METHOD, DEVICE, SYSTEM FOR ESTIMATING REMAINING CHARGING TIME AND STORAGE MEDIUM

(71) Applicant: Contemporary Amperex Technology Co., Limited, Ningde (CN)

(72) Inventors: Jian Ruan, Ningde (CN); Shichao Li, Ningde (CN); Yanhua Lu, Ningde (CN); Yizhen Hou, Ningde (CN); Wei Zhang, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 0 days.

(21) Appl. No.: 17/043,703

(22) PCT Filed: Nov. 29, 2019

(86) PCT No.: PCT/CN2019/122139
§ 371 (c)(1),
(2) Date: Sep. 30, 2020

(87) PCT Pub. No.: WO2020/108638
PCT Pub. Date: Jun. 4, 2020

(65) Prior Publication Data
US 2021/0325466 A1 Oct. 21, 2021

(30) Foreign Application Priority Data

Nov. 30, 2018 (CN) .......................... 201811455643.X

(51) Int. Cl.
*G01R 31/367* (2019.01)
*G01R 31/374* (2019.01)
*H02J 7/00* (2006.01)

(52) U.S. Cl.
CPC ......... *G01R 31/367* (2019.01); *G01R 31/374* (2019.01); *H02J 7/0047* (2013.01)

(58) Field of Classification Search
CPC .... G01R 31/367; G01R 31/374; H02J 7/0047
See application file for complete search history.

(56) References Cited

FOREIGN PATENT DOCUMENTS

| CN | 102707234 A | 10/2012 |
|----|-------------|---------|
| CN | 103675706 A | 3/2014 |

(Continued)

OTHER PUBLICATIONS

Ruan et al., Stepwise Segmented Charging Technique for Lithium-Ion Battery to Induce Thermal Management by Low-Temperature Internal Heating, 2014, ITEC Asia—Pacific 2014, 6 pp. (Year: 2014).*

(Continued)

*Primary Examiner* — Toan M Le
(74) *Attorney, Agent, or Firm* — Law Offices of Liaoteng Wang

(57) ABSTRACT

A method includes: estimating a first estimated time required for the battery to be charged from the state of charge estimation initial value to an upper limit of the state of charge estimation section; estimating a second estimated time required for the battery to be changed in temperature from the temperature estimation initial value to an upper limit of the temperature estimation section; determining a new state of charge estimation initial value, a new state of charge estimation section, and a new temperature estimation initial value and a new temperature estimation section based on a smaller estimated time between the first estimated time and the second estimated time, until an upper limit of an state of charge estimation section reaches a target state of charge and a smaller estimated time is a first estimated time; and accumulating every determined smaller estimated times to obtain an estimated remaining charging time.

14 Claims, 2 Drawing Sheets

(56) References Cited

FOREIGN PATENT DOCUMENTS

| | | | |
|---|---|---|---|
| CN | 104977545 | A | 10/2015 |
| CN | 107179512 | A | 9/2017 |
| CN | 107192960 | A | 9/2017 |
| CN | 107193779 | A | 9/2017 |
| CN | 107991623 | A | 5/2018 |
| CN | 108445400 | A | 8/2018 |
| CN | 108646190 | A | 10/2018 |
| JP | 5650424 | B2 | 11/2014 |
| JP | 2018054521 | A | 4/2018 |
| WO | 2018105881 | A1 | 6/2018 |

OTHER PUBLICATIONS

PCT International Search Report for PCT/CN2019/122139 dated Jan. 23, 2020, 11 pages.

The First Office Action and search report dated Oct. 10, 2020 for Chinese Application No. 201811455643.X, 11 pages.

\* cited by examiner

METHOD, DEVICE, SYSTEM FOR ESTIMATING REMAINING CHARGING TIME AND STORAGE MEDIUM

CROSS-REFERENCE TO RELATED APPLICATION

The present application is a National Stage of International Application No. PCT/CN2019/122139 filed on Nov. 29, 2019, which claims priority to Chinese Patent Application No. 201811455643.X, filed on Nov. 30, 2018 and entitled "METHOD, DEVICE, SYSTEM FOR ESTIMATING REMAINING CHARGING TIME AND STORAGE MEDIUM", which is incorporated herein by reference in its entirety.

TECHNICAL FIELD

The present disclosure relates to the technical field of power batteries, and particularly, to a method, a device, a system for estimating remaining charging time and a storage medium.

BACKGROUND

Traditional power batteries are generally charged in two steps: constant current charging and constant voltage charging. Constant current charging utilizes a constant current to charge a battery to a certain amount of power, and voltage gradually rises. When the voltage reaches a cut-off voltage of the battery, a switch back to the constant voltage charging is performed, and current gradually decreases.

Traditional estimation of remaining charging time of a power battery is usually based on an ampere-hour integration method. The time required to reach full charge is estimated by using required amount of power and charging current, and during charging, State of Charge (State of Charge, SOC) or a voltage value is gradually corrected and used to adjust currently requested charging current. If temperature of the battery is low or the SOC is low, a large error may be caused in the estimation of remaining charging time.

SUMMARY

Embodiments of the present disclosure provide a method, a device, a system for estimating remaining charging time and a storage medium, which takes into account an influence of temperature changes on charging time during charging of a battery, and thus accuracy of estimation of remaining charging time can be improved and jumps in estimated remaining charging time can be avoided.

According to an aspect of embodiments of the present disclosure, a method for estimating remaining charging time is provided. The method includes: acquiring a state of charge estimation initial value and a temperature estimation initial value and determining a charging requested current value corresponding to the state of charge estimation initial value and a battery temperature change rate corresponding to the temperature estimation initial value; determining a state of charge estimation section corresponding to the state of charge estimation initial value and estimating a first estimated time required for a battery to be charged from the state of charge estimation initial value to an upper limit of the state of charge estimation section based on the charging requested current value; determining a temperature estimation section corresponding to the temperature estimation initial value, and estimating a second estimated time required for the battery to be changed in temperature from the temperature estimation initial value to an upper limit of the temperature estimation section based on the battery temperature change rate; determining a new state of charge estimation initial value, a new state of charge estimation section, a new temperature estimation initial value and a new temperature estimation section based on a smaller estimated time between the first estimated time and the second estimated time, until an upper limit of an state of charge estimation section reaches a target state of charge and a smaller estimated time is a first estimated time; and accumulating every determined smaller estimated times to obtain an estimated remaining charging time for the battery to be charged to the target state of charge.

According to another aspect of embodiments of the present disclosure, an apparatus for estimating remaining charging time is provided. The apparatus includes: an initial value acquisition module configured to acquire a state of charge estimation initial value and a temperature estimation initial value and determining a charging requested current value corresponding to the state of charge estimation initial value and a battery temperature change rate corresponding to the temperature estimation initial value; a first time estimation module configured to determine a state of charge estimation section corresponding to the state of charge estimation initial value and estimate a first estimated time required for a battery to be charged from the state of charge estimation initial value to an upper limit of the state of charge estimation section based on the charging requested current value; a second time estimation module configured to determine a temperature estimation section corresponding to the temperature estimation initial value, and estimate a second estimated time required for the battery to be changed in temperature from the temperature estimation initial value to an upper limit of the temperature estimation section based on the battery temperature change rate; an estimation section updating module configured to determine a new state of charge estimation initial value, a new state of charge estimation section, a new temperature estimation initial value and a new temperature estimation section based on a smaller estimated time between the first estimated time and the second estimated time, until an upper limit of an state of charge estimation section reaches a target state of charge and a smaller estimated time is a first estimated time; and an estimated time accumulation module configured to accumulate every determined smaller estimated times to obtain an estimated remaining charging time for the battery to be charged to the target state of charge.

According to still another aspect of embodiments of the present disclosure, a system for estimating remaining charging time is provided. The system includes: a memory and a processor, wherein the memory is configured to store executable program codes, and the processor is configured to read executable program codes stored in the memory to perform a method for estimating remaining charging time as discussed above.

According to yet another aspect of embodiments of the present disclosure, there is provided a computer-readable storage medium. The computer-readable storage medium stores instructions that, when executed on a computer, cause the computer to perform a method for estimating remaining charging as discussed above.

BRIEF DESCRIPTION OF THE DRAWINGS

In order to more clearly illustrate technical solutions of embodiments of the present disclosure, figures used in embodiments of the present disclosure will be briefly described below. Other drawings can be obtained from these figures by those skilled in the art without any inventive effort.

DETAILED DESCRIPTION

Figure 1:
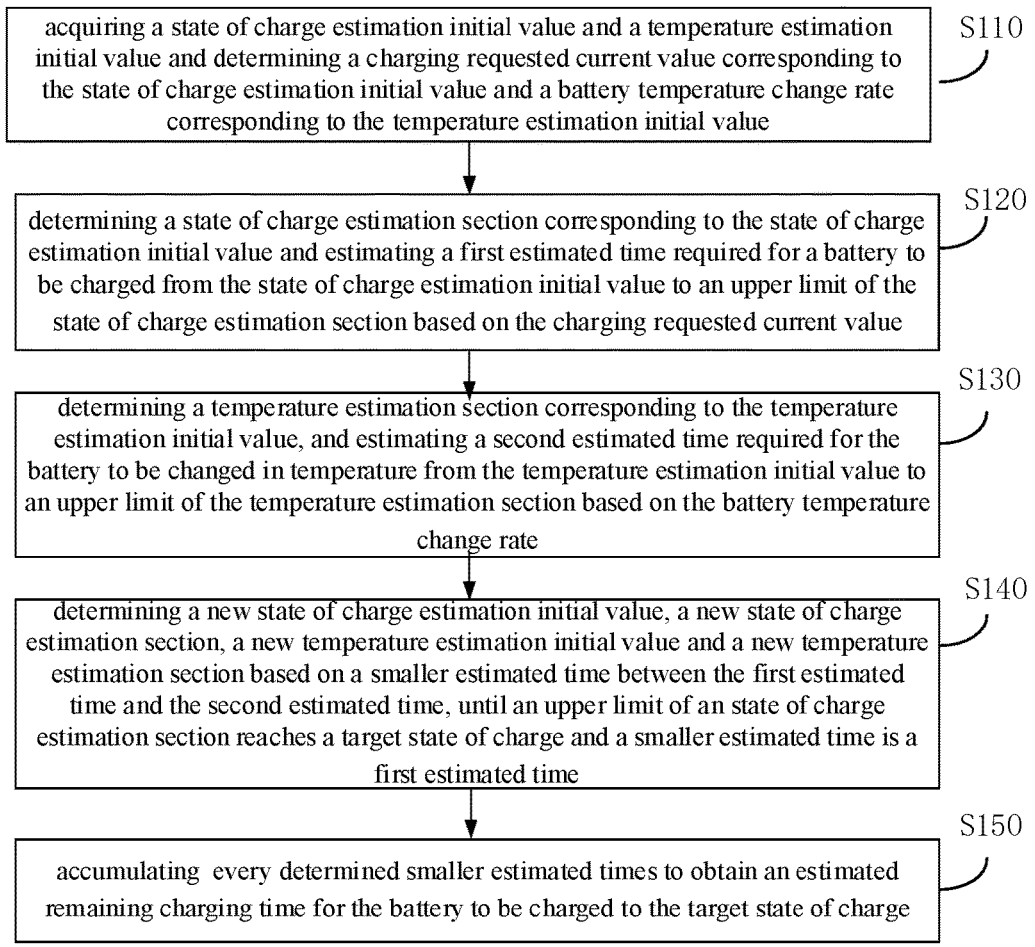
FIG. 1 is a flowchart illustrating a method for estimating remaining charging time according to an embodiment of the present disclosure.

The features and exemplary embodiments of various aspects of the present disclosure will be described in detail below. In order to make the objectives, technical solutions and advantages of the present disclosure clearer, the present disclosure will be described in further detail with reference to the drawings and embodiments. It should be understood that the specific embodiments described herein are only provided to explain the present disclosure and not to limit the present disclosure. To those skilled in the art, the present disclosure may be practiced without requiring some of these specific details. The following description of the embodiments is merely for providing a better understanding of the present disclosure by showing examples of the present disclosure.

It should be noted that in this disclosure, relational terms such as first and second are used only to distinguish one entity or operation from another entity or operation, and do not necessarily require or imply that these entities or operations must have any such actual relationship or order among them. Moreover, the terms "includes/including", "comprises/comprising", or any other variation thereof are intended to encompass non-exclusive inclusion, such that a process, method, article, or device that includes a series of elements includes not only those elements but also those that are not explicitly listed or those inherent to such a process, method, article, or device. Without more restrictions, the elements defined by the sentence "comprises/comprising . . . " do not exclude existence of other elements in the process, method, article, or device including the elements.

A battery in embodiments of the present disclosure may be a battery capable of releasing a positive electrode and a negative electrode and receiving energy-carrying particles, such as a lithium ion battery, and the like, which is not limited herein. In terms of scale, the battery described in embodiments of the present disclosure may be a battery cell, or a battery module or a battery pack, which is not limited herein.

As an example, when the power battery is a lithium ion battery, the method for estimating remaining charging time according to an embodiment of the present disclosure is applicable to an electric vehicle using a lithium ion power battery as a power system or an individual lithium ion power battery system or product or an individual lithium ion battery energy storage system or product.

In embodiments of the present disclosure, after the battery is connected to a charging device, the battery system performs a self-test to detect whether the battery is correctly connected with the charging device battery and whether the battery receives a temperature monitoring signal. When all signals are ready and an output is normal, a charging mode is turned on.

In embodiments of the present disclosure, after the charging mode is turned on, for each of remaining charging time estimation phases, a remaining charging time estimation module (hereinafter may be referred to as estimation module) obtains current battery temperature from sampling data of the battery, and obtains a current SOC value from a SOC estimation module, and uses the current battery temperature as a temperature estimation starting point and the current SOC value as SOC estimation starting point. In addition, the battery management system (Battery Management System, BMS) in embodiments of the present disclosure can use a sampled voltage value of the battery as an input to estimate the remaining charging time, use a sampled current value together with the sampled voltage value of the battery to estimate the SOC, and then convert the SOC to OCV (Open Circuit Voltage, OCV) based on correlation between SOCs and OCVs to estimate the remaining charging time.

Because the SOC value or voltage value may be continuously corrected during the charging to adjust currently requested charging current, where an influence of temperature changes on charging effects during charging of the battery is not taken into consideration, a large error will be caused at a low temperature or a low SOC.

Embodiments of the present disclosure provide a method, a device, a system for estimating remaining charging time and a storage medium, which can accurately estimate required charging time from a current SOC value to any SOC target value, and can update calculation result in real time and feed it back to a user.

Further, since a battery state such as SOC and temperature of the battery are recorded in real time during the calculation process, the estimated remaining charging time will not change rapidly and goes back, and the remaining charging time will slowly decrease as a change of SOC.

In order to better understand the present disclosure, the method, device, system for estimating remaining charging time and storage medium according to embodiments of the present disclosure will be described in detail below with reference to the accompanying drawings. It should be noted that these embodiments are not intended to limit scope of the present disclosure.

FIG. 1 is a flowchart illustrating a method for estimating remaining charging time according to an embodiment of the present disclosure. As shown in FIG. 1, the method 100 according to an embodiment of the present disclosure includes the following steps S110 to S150.

At step S110, a state of charge estimation initial value and a temperature estimation initial value are acquired and a charging requested current value corresponding to the state of charge estimation initial value and a battery temperature change rate corresponding to the temperature estimation initial value are determined.

A step S120, a state of charge estimation section corresponding to the state of charge estimation initial value is determined and a first estimated time required for a battery to be charged from the state of charge estimation initial value to an upper limit of the state of charge estimation section is estimated based on the charging requested current value.

At step S130: a temperature estimation section corresponding to the temperature estimation initial value is determined, and a second estimated time required for the battery to be changed in temperature from the temperature estimation initial value to an upper limit of the temperature estimation section is estimated based on the battery temperature change rate.

At step S140: a new state of charge estimation initial value, a new state of charge estimation section, a new temperature estimation initial value and a new temperature estimation section are determined based on a smaller estimated time between the first estimated time and the second estimated time, until an upper limit of an state of charge estimation section reaches a target state of charge and a smaller estimated time is a first estimated time determined by estimation.

At step S150, every determined smaller estimated times are accumulated to obtain an estimated remaining charging time for the battery to be charged to the target state of charge.

According to the method for estimating remaining charging time according to an embodiment of the present disclosure, the remaining charging time is calculated based on a charging requested current by taking into account an influence of temperature changes of the battery on calculation of the remaining charging time, so that accuracy of estimation of remaining charging time can be improved, thereby solving an problem of inaccurate estimation of remaining charging time for a lithium ion battery system to reach a target SOC during charging.

In an embodiment, step S110 may include steps S111 and S112.

At step S111, the charging requested current value is determined according to the state of charge estimation initial value and the temperature estimation initial value, based on a first correspondence between a charging requested current and a state of charge as well as a temperature of the battery.

In an embodiment, the state of charge estimation initial value may be a SOC value indicative of state of charge calculated by the BMS system. The temperature estimation initial value may be a current temperature value of the battery system sensed by a temperature sensor.

In an embodiment, the first correspondence may include a correspondence between a charging requested current and a state of charge as well as a temperature of the battery determined through a predetermined two dimensional lookup table for charging requested currents. In some embodiments, it is possible to conduct a large number of tests on the battery system to calculate particular values of charging requested currents under different SOCs and temperatures of the battery, and establish correspondence between charging requested currents and state of charges as well as temperatures of the battery, in order to create the two dimensional lookup table for charging requested currents.

As an example, Table 1 exemplarily shows an example of parameters of charging requested current values corresponding to temperatures and state of charges of a battery during a charging process of the battery according to an embodiment of the present disclosure. It should be noted that in embodiments of the present disclosure, the correspondence between a requested charging current and a temperature as well as a state of charge (SOC) for a battery is not limited to the example in Table 1.

TABLE 1

| Current Temperature | SO | | | | | |
|---|---|---|---|---|---|---|
| | 10%-20% | 20%-30% | 30%-40% | 40%-50% | . . . | 90%-100% |
| −30° C.~−20° C. | $I_1$ | $I_2$ | $I_3$ | $I_4$ | $I_5$ | $I_6$ |
| −20° C.~−10° C. | $I_7$ | . . . | . . . | . . . | . . . | . . . |

TABLE 1-continued

| Current Temperature | SO | | | | | |
|---|---|---|---|---|---|---|
| | 10%-20% | 20%-30% | 30%-40% | 40%-50% | . . . | 90%-100% |
| −10° C.~0° C. | $I_8$ | . . . | . . . | . . . | . . . | . . . |
| 0° C.~10° C. | $I_9$ | . . . | . . . | . . . | . . . | . . . |
| . . . | . . . | . . . | . . . | . . . | . . . | . . . |
| 50° C.~60° C. | $I_{10}$ | $I_{11}$ | $I_{12}$ | $I_{13}$ | $I_{14}$ | $I_{15}$ |

The above Table 1 shows correspondence between charging requested currents and state of charges as well as temperatures of the battery. "T" in Table 1 indicates a temperature of the battery, "SOC" indicates a state of charge of the battery, and "$I_R$" indicates a charging requested current. By querying, for example, the two dimensional lookup table for charging requested currents in Table 1, a charging requested current is determined by a temperature and a state of charges of the battery.

With continued reference to Table 1, temperature of the battery applicable to embodiments of the present disclosure may range from −30° C. to 60° C., and the SOC of the battery may range from 0% to 100%. In addition, in the correspondence between charging requested currents and state of charges as well as temperatures of the battery described in Table 1, a plurality of preset state of charge change sections, such as 10%-20%, 20%-30% or the like are included, and a plurality of temperature change sections, such as −30° C. to −20° C., −20° C. to −10° C. or the like are included.

At step S112, the corresponding battery temperature change rate is determined according to the state of charge estimation initial value and the temperature estimation initial value based on a second correspondence between a battery temperature change rate and at least a state of charges and a temperature of the battery.

In one embodiment, the second correspondence includes: a correspondence between a battery temperature change rate and a state of charge as well as a temperature of the battery, which is determined through a predetermined first lookup table for battery temperature change rates, or includes a correspondence between a battery temperature change rate and a state of charge as well as a temperature of the battery together with a predetermined heating and cooling power of a charging system, which is determined through a predetermined second lookup table for battery temperature change rates.

In some embodiments, it is possible to conduct a large number of tests on the battery system to calculate particular values of battery temperature change rates under different SOCs and temperatures of the battery, and establish correspondence between battery temperature change rates and state of charges as well as temperatures of the battery, in order to create the two dimensional lookup table for battery temperature change rates.

As an example, Table 2 exemplarily shows an example of parameters of battery temperature change rates corresponding to temperatures and state of charges of a battery during a charging process of the battery according to an embodiment of the present disclosure. It should be noted that in embodiments of the present disclosure, the correspondence between a battery temperature change rate and a temperature as well as a SOC for a battery is not limited to the example in Table 2.

TABLE 2

| Rate Temperature | SO | | | | | |
|---|---|---|---|---|---|---|
| | 10%-20% | 20%-30% | 30%-40% | 40%-50% | ... | 90%-100% |
| −30° C.~−20° C. | $X_1$° C./min | $X_2$° C./min | $X_3$° C./min | $X_4$° C./min | ... | $X_6$° C./min |
| −20° C.~−10° C. | $X_7$° C./min | ... | ... | ... | ... | ... |
| −10° C.~0° C. | $X_8$° C./min | ... | ... | ... | ... | ... |
| 0° C.~10° C. | $X_9$° C./min | ... | ... | ... | ... | ... |
| ... | ... | ... | ... | ... | ... | ... |
| 50° C.~60° C. | $X_{10}$° C./min | $X_{11}$° C./min | $X_{12}$° C./min | $X_{13}$° C./min | ... | $X_{15}$° C./min |

The above Table 2 shows correspondence between temperature change rate of a battery and state of charges as well as temperatures of the battery. "T" in Table 2 indicates temperature of the battery, "SOC" indicates state of charge of the battery, and "TCR" indicates temperature change rate of the battery. By querying, for example, the two dimensional lookup table for temperature change rates in Table 2, a temperature change rate of the battery is determined by a temperature and a state of charges of the battery.

In addition, in the correspondence between temperature change rates and state of charges as well as temperatures of the battery described in Table 2, a plurality of preset state of charge change sections, such as 10%-20%, 20%-30% or the like are included, and a plurality of temperature change sections, such as −30° C. to −20° C., −20° C. to −10° C. or the like are included.

In an embodiment, an output current value of the charging device can be used to correct the charging requested current value to obtain a corrected actual charging current value corresponding to the state of charge estimation initial value. That is, in an embodiment, step S110 may include step S111 and step S112.

At step S111, the charging requested current value is determined according to the state of charge estimation initial value and the temperature estimation initial value based on the predetermined first correspondence between a charging requested current and a state of charge as well as a temperature of the battery.

At step S112, the charging requested current value is corrected by using an output current value of the charging device to determine a corrected actual charging current value corresponding to the state of charge estimation initial value.

In an embodiment, the step S112 may include step S112-01 to step S112-04.

At step S112-01, after start of charging of the battery, a temperature and a state of charge of the battery and an actual output current of the charging device corresponding to the monitored temperature and state of charge of the battery are monitored within a predetermined period of time.

At step S112-02, a charging requested current value corresponding to the monitored temperature and state of charge of the battery is determined.

Step S112-03, a current value proportional relationship between the actual output current of the charging device and the charging requested current value is calculated.

Step S112-04, an actual charging current value corresponding to the state of charge estimation initial value is determined by using the current value proportional relationship and the state of charge estimation initial value.

In this embodiment, the charging current value of the battery used in estimation of charging time may be considered to be corrected by the output current of the charging device. At beginning of the charging, a charging requested current as determined by the BMS is used for calculation. During the charging, output current values of the charging device are extracted for a period of time, and a proportional relationship between output currents of the charging device and the charging requested currents is determined. Then, the proportional relationship is used to correct a charging requested current of the BMS to obtain an actual charging current value for use in the estimation of remaining charging time.

In an embodiment, the step S120 may include step S121 to S123.

At step S121, a state of charge change section among a plurality of preset state of charge change sections determined based on the state of charge estimation initial value and an upper limit of a state of charge change section to which the state of charge initial value belongs is determined as the state of charge estimation section.

In step S122, the charging requested current value is corrected by using an output current value of a charging device and a corrected actual charging current value corresponding to the state of charge estimation initial value is determined.

The specific steps for correcting the charging requested current value in step S122 are the same as or equivalent to the specific steps for correcting the charging requested current value in the foregoing embodiment, and details are not described herein again.

In an embodiment, the same or equivalent steps may be used to determine an actual charging current value corresponding to the upper limit of the state of charge estimation section based on the output current value of the charging device and the charging requested current value determined according to the above discussed first correspondence.

At step S123: based on the actual charging current value, the first estimated time required for the battery to be charged from the state of charge estimation initial value to the upper limit of the state of charge estimation section is estimated.

In an embodiment, a first charging requested current value may be determined by using the first correspondence between a charging requested current and a state of charge and a temperature of the battery based on $SOC_{i-1}$ and temperature estimation initial value; and a second charging requested current value may be determined by using the first correspondence based on $SOC_i$ and the temperature estimation initial value.

In an embodiment, if the first charging requested current value and the second charging requested current value are the same, the first charging requested current value is used as the charging requested current value corresponding to SOCs from the state of charge estimation initial value $SOC_{i-1}$ to the upper limit $SOC_i$ of the corresponding state of charge estimation initial value.

In an embodiment, values of state of charges in a plurality of state of charges change sections may be not overlapped.

In another embodiment, if the first requested charge current value and the second requested charge current value are not the same, that is, the upper limit $SOC_i$ of the state of charge estimation section is used as a SOC boundary value, which is a lower limit of another state of charge change section. At this time, between the first charging requested current value and the second charging requested current value, the charging requested current value for a larger SOC section is selected as the charging requested current value corresponding to SOCs from the state of charge estimation initial value $SOC_{i-1}$ to the upper limit $SOC_i$ of the corresponding state of charge estimation initial value.

In this embodiment, the method for determining the actual charging current value described in the foregoing embodiment is used to calculate the actual charging current value corresponding to SOCs from the state of charge estimation initial value to the upper limit of the corresponding state of charge estimation section.

In an embodiment, the step S130 may include steps S131 and step S132.

At step S131, among a plurality of preset temperature change sections for the battery, a temperature change section determined based on the temperature estimation initial value and an upper limit of a temperature change section to which the temperature estimation initial value belongs is determined as the temperature estimation section.

In step S132, the second estimated time required for the battery to be changed in temperature from the temperature estimation initial value to the upper limit of the temperature estimation section is determined based on the battery temperature change rate.

In an embodiment, the step S140 may include step S141 and S142.

At step S141, the smaller estimated time is the first estimated time. A next state of charge change section being after the state of charge change section to which the state of charge estimation initial value belongs is determined as the new state of charge estimation section. An initial value of the new state of charge estimation section is used as the new state of charge estimation initial value.

In step S142, a temperature value calculated based on the first estimated time and the battery temperature change rate is determined as the new temperature estimation initial value, and a temperature section determined according to the new temperature estimation initial value and an upper limit of the battery temperature change section is determined as the new temperature estimation section.

In an embodiment, step S140 may include step S143 and S144.

At step S143, when the smaller estimated time is the second estimated time, a state of charge obtained based on the second estimated time and the charging requested current value is determined as the new state of charge estimation initial value, and a state of charge change section determined based on the new state of charge estimation initial value and an upper limit of a state of charge change section to which the new state of charge estimation initial value belongs is determined as the new state of charge estimation section.

At step S144, a next temperature change section being after a temperature change section to which the temperature estimation initial value belongs is determined as the new temperature estimation section, and an initial value of the new temperature estimation section is determined as the new temperature estimation initial value.

In the embodiment of the present disclosure, when an upper limit of a state of charge estimation section reaches the target state of charge and a smaller estimated time is a first estimated time, it indicates that the battery has been charged to the target state of charge. At the point, every determined smaller estimated times are accumulated to obtain estimated remaining charging time required for the battery to be charged to the target state of charge.

In an embodiment, the target state of charge may be a preset value, such as 100% or another setting value of SOC.

In an embodiment, the estimated remaining time required for the battery to be charged the target state of charge may be calculated by the following expression (1).

$$T_{total} = \sum_{i=1}^{n} \min\left[\left(\frac{SOC_i - SOC_{i-1}}{I_i}\right) \cdot \left(\frac{T_j - T_{j-1}}{Trate_j}\right)\right] \quad (1)$$

In the above expression (1), $SOC_i$ is an upper limit of an estimation section of the $i^{th}$ state of charge, $SOC_{i-1}$ is a state of charge estimation initial value of estimation section of the $i^{th}$ state of charge, $I_i$ is an actual charging current value corresponding to the state of charge estimation initial value of the $i^{th}$ state of charge estimation section to the upper limit of the corresponding state of charge estimation section, C is capacity of the battery, $T_j$ is an upper limit of the $j^{th}$ temperature estimation section, $T_{j-1}$ is an temperature estimation initial value of $j^{th}$ temperature estimation section, $Trate_j$ is a battery temperature change rate corresponding to a change from the temperature estimation initial value to the upper limit of the temperature estimation section. As an example, $SOC_1$ is an initial SOC value and $SOC_n$ is a target SOC value.

In the embodiment of the present disclosure, a two dimensional lookup table for charging currents is used in combination with battery temperature change rates during the charging process. In the estimation of the remaining charging time of the battery, an influence of temperature changes on calculation of the remaining charging time is taken into consideration, so the optimized algorithm makes the estimation more accurate.

A method for estimating remaining charging time according to another embodiment of the present disclosure is described below. In an embodiment, at step S130, the step for determining the temperature estimation section corresponding to the temperature estimation initial value may include step S11 to step S13.

At step S11, the charging requested current value is corrected by using an output current value of a charging device, and a corrected actual charging current value corresponding to the state of charge estimation initial value is determined.

At step S12, a battery temperature change rate and a battery temperature value at a next time point of the charging corresponding to the actual charging current value are calculated by using a calculation equation corresponding to energy conservation based on the actual charging current value, parameters of the battery, and parameters of the charging system.

In an embodiment, the battery temperature change rate and the battery temperature value at a next time point of the charging corresponding to the actual charging current value may be calculated by the following expression (2) describing a calculation equation corresponding to energy conservation.

$$\begin{cases} c_{p\_b} m_b \dfrac{dT_b}{dt} = Q'_{in} + Q'_{out} \\ Q'_{in} = I\left(U^{av} - T\dfrac{\partial U^{av}}{\partial T}\right) - IE \end{cases} \quad (2)$$

In the above expression (2), $c_{p\_b}$ is an equivalent specific heat of the battery, $m_b$ is the mass of the battery, $$\dfrac{dT_b}{dt}$$

is an temperature change rate of the battery system, $Q_m'$ is an internal heating rate of the battery, $Q_{out}'$ is an external heating and cooling power, I is the present current, $U^{av}$ is an open circuit voltage of the battery, and E is an operation voltage of the battery, T is the calculated battery temperature, that is, a temperature value at a next time point calculated based on present temperature and the present current of the battery.

In an embodiment, the present current I may take a value of the actual charging current value obtained by correcting the charging requested current described in the foregoing embodiment.

In an embodiment, a preset lookup table for change rates of an open circuit voltage of a battery can be queried to determine a change rate of the open circuit voltage of the battery corresponding to a state of charge of the battery, a temperature estimation initial value, a preset operation voltage of the battery, an output current of a charging device charging the battery and a preset open circuit voltage of the battery.

In an embodiment, the value of the internal heating rate $Q_m'$ of the battery and the value of the external heating and cooling power $Q_{out}'$ may be a rated values of an internal heating rate and an external heating and cooling power of the battery obtained according to experiments.

In step S13, the battery temperature value at the next time point is determined as an upper limit of the temperature estimation section, and the temperature estimation section is determined based on the temperature estimation initial value and the upper limit of the temperature estimation section.

In this embodiment, the preset parameters of the battery may include: the state of charge of the battery, the temperature of the battery, the preset operation voltage of the battery, the preset open circuit voltage of the battery, the preset equivalent specific heat of the battery, and the mass of the battery, as described in the above embodiments. The preset parameters of the charging system may include: the output current of charging device charging the battery, present current, and the preset external heating and cooling power, as described in the above embodiments.

In an embodiment, in the process of calculating the battery temperature change rate according to the above equation (1), the required parameters include, but are not limited to, the battery's mass, size and equivalent physical parameters, a reversible thermal calculation model internal of the battery system, an internal resistance change model of the battery, an open circuit voltage model of the battery, sampled operation voltages of the battery, an equivalent thermal conductivity of the battery, heat exchange coefficients between the battery system and external environment, heating or cooling power of external systems such as a battery heater and a battery cooler and their respective work efficiency and heat exchange efficiency, etc. The above parameters or models can be obtained through corresponding equations or lookup tables.

In an embodiment, the way of external heating and cooling may include, but is not limited to, working fluid heating and cooling, air cooling, natural cooling, gas heating, resistance heating, and the like. The way of heat exchange may include heat conduction by heaters, heat radiation, and heat convection.

In the above embodiments, a temperature change of the battery system can be calculated according to an energy conservation equation of the battery system. The battery system here can be a battery cell, a battery module or a Pack system. In calculation of the battery temperature change rate, internal heat generation in the battery system and external heating and cooling for the battery system are taken into account, and model parameters are supplemented and coefficients are corrected by a large number of experiments, so that a temperature value of the battery at a subsequent moment can be accurately estimated.

In an embodiment, in the method 100 for estimating remaining charging time, the step S130 of estimating the second estimated time required for the battery to be changed in temperature from the temperature estimation initial value to the upper limit of the temperature estimation section may further include: performing an integration operation in time domain based on the temperature estimation initial value and the actual charging current value, and estimating the second estimated time required for the battery to be changed in temperature from the temperature estimation initial value to the upper limit of the temperature estimation section based on the integration operation.

In this embodiment, using the above equation (2), the second estimated time required for the battery to be changed in temperature from the temperature estimation initial value to the upper limit of the temperature estimation section is determined by using an integration operation based on the temperature estimation initial value, the actual charging current value, parameters of the battery and parameters of the battery system.

In an embodiment, the step S140 may include: determining, when the smaller estimated time is the first estimated time, a next state of charge change section being after a state of charge change section to which the state of charge estimation initial value belongs, as the new state of charge estimation section, wherein an initial value of the new state of charge estimation section is the new state of charge estimation initial value; and determining the upper limit of the temperature estimation section as an upper limit of the new temperature estimation section, and determining a temperature value of the battery at the first estimated time during the integration operation as the new temperature estimation initial value, so as to determine the new temperature estimation section.

In this embodiment, the smaller estimated time is the first estimated time, which means the time required for the state of charge to reach the upper limit of the state of charge change section is less than the time required for the battery temperature to reach the upper limit of the temperature estimation section.

Therefore, a new state of charge change section can be determined through a preset state of charge change section, such as those listed in Table 1 in the above embodiments.

The upper limit of the present temperature estimation section is determined as an upper limit of the new temperature estimation section, and a battery temperature determined by using the above equation (2) at a time point when the first estimated time has passed since the temperature estimation initial value is determined as the new initial temperature of the new temperature estimation section.

In an embodiment, the step S140 may include: determining, when the smaller estimated time is the second estimated time, the upper limit of the state of charge estimation section as an upper limit of the new state of charge estimation section, and determining a state of charge obtained based on the second estimated time and the charging requested current value as the new state of charge estimation initial value, so as to determine the new state of charge estimation section; and determining a next temperature change section among a plurality of temperature change sections for the battery being after a temperature change section to which the temperature estimation initial value belongs, as the new temperature estimation section, and determining an initial value of the new temperature estimation section as the new temperature estimation initial value.

In this embodiment, the smaller estimated time is the second estimated time, which means the time required for the state of charge to reach the upper limit of the state of charge change section is greater than the time required for the battery temperature to reach the upper limit of the temperature estimation section.

Therefore, the new battery temperature change section may be determined from a plurality of preset battery temperature change sections, for example, by querying Table 1 described in the above embodiments.

The upper limit of the present state of charge estimation section is used as the upper limit of the new state of charge estimation section, and a state of charge determined using the second estimated time and the battery current is used as an initial value of the new state of charge estimation section.

In the embodiment of the present disclosure, a two dimensional lookup table for charging currents is used to determine a temperature of the battery after charging of the battery starts according to energy conservation of the battery during charging based on magnitude of a battery current and heating and cooling power of the system during the charging process. In the calculation of the remaining charging time, an influence of temperature changes on the calculation of the remaining charging time is taken into consideration, so that the optimized algorithm makes the estimation more accurate.

The remaining charging time estimation device according to an embodiment of the present disclosure will be described in detail below with reference to the drawings.

Figure 2:
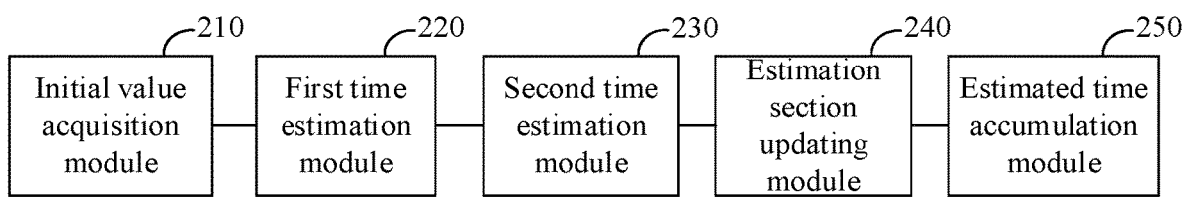
FIG. 2 is a schematic structural diagram illustrating an apparatus for estimating remaining charging time according to an embodiment of the present disclosure.

FIG. 2 is a schematic structural diagram illustrating an apparatus for estimating remaining charging time according to an embodiment of the present disclosure. As shown in FIG. 2, the apparatus 200 for estimating remaining charging time includes: an initial value acquisition module 210, a first time estimation module 220, a second time estimation module 230, an estimation section updating module 240, and an estimated time accumulation module 250.

The initial value acquisition module 210 is configured to acquire a state of charge estimation initial value and a temperature estimation initial value and determine a charging requested current value corresponding to the state of charge estimation initial value and a battery temperature change rate corresponding to the temperature estimation initial value.

The first time estimation module 220 is configured to determine a state of charge estimation section corresponding to the state of charge estimation initial value and estimate a first estimated time required for a battery to be charged from the state of charge estimation initial value to a upper limit of the state of charge estimation section based on the charging requested current value.

The second time estimation module 230 is configured to determine a temperature estimation section corresponding to the temperature estimation initial value, and estimate a second estimated time required for the battery to be changed in temperature from the temperature estimation initial value to an upper limit of the temperature estimation section based on the battery temperature change rate.

The estimated section updating module 240 is configured to determine a new state of charge estimation initial value, a new state of charge estimation section, a new temperature estimation initial value and a new temperature estimation section based on a smaller estimated time between the first estimated time and the second estimated time, until an upper limit of an state of charge estimation section reaches a target state of charge and a smaller estimated time is a first estimated time.

The estimated time accumulation module 250 is configured to accumulate every determined smaller estimated times to obtain an estimated remaining charging time for the battery to be charged to the target state of charge.

In an embodiment, the initial value acquisition module 210 may include: a charging requested current determination unit and a battery temperature change rate determination unit.

The charging requested current determination unit is configured to determine the charging requested current value according to the state of charge estimation initial value and the temperature estimation initial value based on a first correspondence between a charging requested current and a state of charge as well as a temperature of the battery.

The battery temperature change rate determination unit is configured to determine the battery temperature change rate according to the state of charge estimation initial value and the temperature estimation initial value based on a second correspondence between a battery temperature change rate and at least a state of charges and a temperature of the battery.

In an embodiment, the first correspondence includes a correspondence between a charging requested current and a state of charge as well as a temperature of the battery determined through a predetermined two dimensional lookup table for charging requested currents.

The second correspondence includes a correspondence between a battery temperature change rate and a state of charge as well as a temperature of the battery determined through a predetermined first lookup table for battery temperature change rates, or includes a correspondence between a battery temperature change rate and a state of charge as well as a temperature of the battery together with a heating and cooling power of a charging system determined through a predetermined second lookup table for battery temperature change rates.

In an embodiment, the initial value acquisition module 210 may include: a charging requested current determination unit, a charging requested current correction unit, and a battery temperature change rate estimation unit.

The charging requested current determination unit is configured to determine the charging requested current value according to the state of charge estimation initial value and the temperature estimation initial value based on the predetermined first correspondence between a charging requested current and a state of charge as well as a temperature of the battery.

The charging requested current correction unit is configured to correcting the charging requested current value by using an output current value of the charging device to determine a corrected actual charging current value corresponding to the state of charge estimation initial value.

The battery temperature change rate estimation unit is configured to estimate the first estimated time required for a battery to be charged from the state of charge estimation initial value to an upper limit of the state of charge estimation section based on the actual charging requested current value.

In an embodiment, the first time estimation module 220 may include: a state of charge estimation section determination unit, a charging requested current correction unit, and a first estimation unit.

The state of charge estimation section determination unit is configured to determine a state of charge change section among a plurality of preset state of charge change sections determined based on the state of charge estimation initial value and an upper limit of a state of charge change section to which the state of charge initial value belongs as the state of charge estimation section.

The charging requested current correction unit is configured to correcting the charging requested current value by using an output current value of a charging device and a corrected actual charging current value corresponding to the state of charge estimation initial value.

The first estimation unit is configured to estimating the first estimated time required for the battery to be charged from the state of charge estimation initial value to the upper limit of the state of charge estimation section based on the actual charging current value.

In an embodiment, the charging requested current correction unit may be configured to: monitor, after start of charging of the battery, a temperature and a state of charge of the battery and an actual output current of the charging device corresponding to the monitored temperature and state of charge of the battery within a predetermined period of time; determine a charging requested current value corresponding to the monitored temperature and state of charge of the battery; calculate a current value proportional relationship between the actual output current of the charging device and the charging requested current value; and determine an actual charging current value corresponding to the state of charge estimation initial value by using the current value proportional relationship and the state of charge estimation initial value.

In an embodiment, the second time estimation module 230 may include: a temperature estimation section determining unit and a second estimation unit.

The temperature estimation section determining unit is configured to determine a temperature change section among a plurality of preset temperature change sections for the battery determined based on the temperature estimation initial value and an upper limit of a temperature change section to which the temperature estimation initial value belongs as the temperature estimation section.

The second estimation unit is configured to estimating the second estimated time required for the battery to be changed in temperature from the temperature estimation initial value to the upper limit of the temperature estimation section based on the battery temperature change rate.

In an embodiment, the estimation section updating module 240 may include: a state of charge estimation section updating unit and a temperature estimation section updating unit.

The state of charge estimation section updating unit is configured to: determine, when the smaller estimated time is the first estimated time, a next state of charge change section being after the state of charge change section to which the state of charge estimation initial value belongs, as the new state of charge estimation section. An initial value of the new state of charge estimation section is used as the new state of charge estimation initial value.

The temperature estimation section updating unit is configured to use an upper limit of the battery temperature estimation section as an upper limit of the new temperature estimation section and use a temperature value calculated based on the first estimated time and the battery temperature change rate as the new temperature estimation initial value, so as to determine the new temperature estimation section.

In an embodiment, the estimation section updating module 240 may include: a state of charge estimation section updating unit and a temperature estimation section updating unit.

The state of charge estimation section updating unit is configured to determine, when the smaller estimated time is the second estimated time, an upper limit of the state of charge estimation section as an upper limit of the new state of charge estimation section, and uses a state of charge obtained based on the second estimated time and the charging requested current value as the new state of charge estimation initial value, so as to determine the new state of charge estimation section.

The temperature estimation section updating unit is configured to determine a next temperature change section being after a temperature change section to which the temperature estimation initial value belongs, as the new temperature estimation section, and determine an initial value of the new temperature estimation section as the new temperature estimation initial value.

According to the apparatus for estimating remaining charging time according to the embodiment of the present disclosure, a two dimensional lookup table for charging currents is used in combination with battery temperature change rates during the charging process. In the estimation of the remaining charging time of the battery, an influence of temperature changes on calculation of the remaining charging time is taken into consideration, so the optimized algorithm makes the estimation more accurate.

In an embodiment, the second time estimation module 230 may include a temperature estimation section determination unit.

The temperature estimation section determination unit is configured to correct the charging requested current value by using an output current value of a charging device, and determine a corrected actual charging current value corresponding to the state of charge estimation initial value; calculate a battery temperature change rate and a battery temperature value at a next time point of the charging corresponding to the actual charging current value by using a calculation equation corresponding to energy conservation based on the actual charging current value, parameters of the battery, and parameters of the charging system; and determine the battery temperature value at the next time point as an upper limit of a temperature estimation section, and determine the temperature estimation section determined based on the temperature estimation initial value and the upper limit of the temperature estimation section.

In an embodiment, the second estimation unit may be further configured to perform an integration operation in time domain based on the temperature estimation initial value and the actual charging current value, and estimate the second estimated time required for the battery to be changed in temperature from the temperature estimation initial value to the upper limit of the temperature estimation section based on the integration operation.

In an embodiment, the estimation section updating module 240 may include: a state of charge estimation section updating unit and a temperature estimation section updating unit.

The state of charge estimation section updating unit is configured to determine, when the smaller estimated time is the first estimated time, a next state of charge change section being after a state of charge change section to which state of charge estimation initial value belongs, as the new state of charge estimation section, and determine an initial value of the new temperature estimation section as the new state of charge estimation initial value.

The temperature estimation section updating unit is configured to determine the upper limit of the temperature estimation section as an upper limit of the new temperature estimation section, and determine a temperature value of the battery at the first estimated time during the integration operation as the new temperature estimation initial value, so as to determine the new temperature estimation section.

In an embodiment, the estimation section updating module 240 may include: a state of charge estimation section updating unit and a temperature estimation section updating unit.

The state of charge estimation section updating unit is configured to determine, when the smaller estimated time is the second estimated time, the upper limit of the state of charge estimation section as an upper limit of the new state of charge estimation section, and determine a state of charge obtained based on the second estimated time and the charging requested current value as the new state of charge estimation initial value, so as to determine the new state of charge estimation section.

The temperature estimation section updating unit is configured to determine a next temperature change section among a plurality of temperature change sections for the battery being after a temperature change section to which the temperature estimation initial value belongs, as the new temperature estimation section, and determine an initial value of the new temperature estimation section as the new temperature estimation initial value.

According to the apparatus for estimating remaining charging time according to the embodiment of the present disclosure, a two dimensional lookup table for charging currents is used in combination with battery temperature change rates during the charging process. In the estimation of the remaining charging time of the battery, an influence of temperature changes on calculation of the remaining charging time is taken into consideration, so the optimized algorithm makes the estimation more accurate.

To be clear, the present disclosure is not limited to the specific configurations and processes described in the above embodiments and illustrated in the drawings. For the convenience and brevity of the description, detailed descriptions of known methods are omitted here, and the specific operation processes of the systems, modules and units described above may refer to the corresponding processes in the foregoing method embodiments and are not repeated here.

Figure 3:
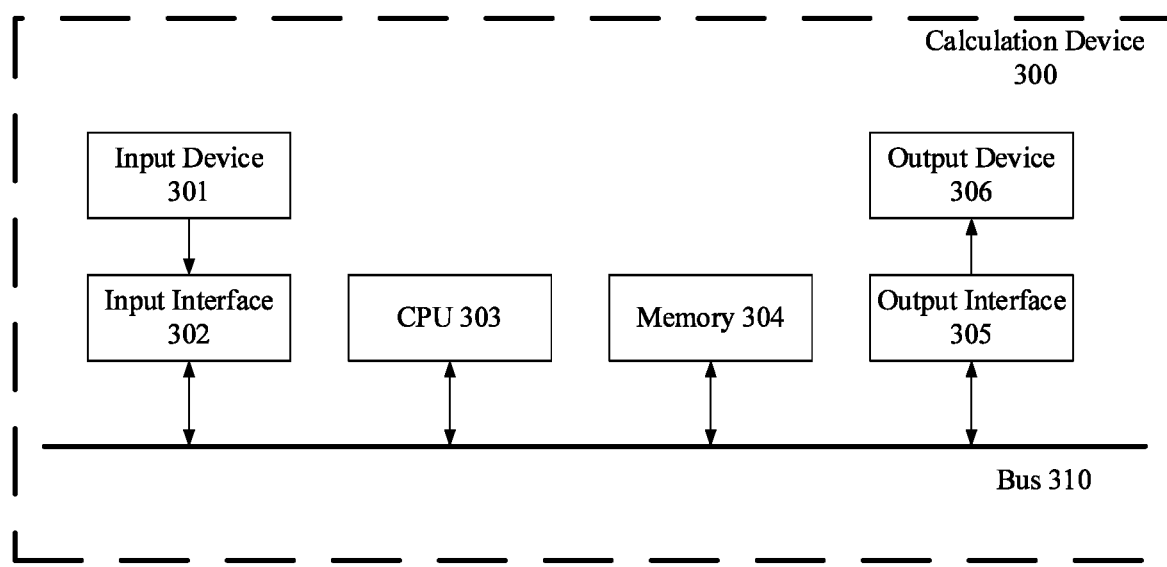
FIG. 3 is a structural diagram illustrating an exemplary hardware architecture of a computing device that can implement the method and apparatus for estimating remaining charging time according to an embodiment of the present disclosure.

FIG. 3 is a structural diagram illustrating an exemplary hardware architecture of a computing device capable of implementing the method and apparatus for estimating remaining charging time according to an embodiment of the present disclosure.

As shown in FIG. 3, the computing device 300 includes an input device 301, an input interface 302, a central processing unit (CPU) 303, a memory 304, an output interface 305, and an output device 306. The input interface 302, the central processing unit 303, the memory 304, and the output interface 305 are connected to each other through a bus 310. The input device 301 and the output device 306 are connected to the bus 310 through the input interface 302 and the output interface 305, respectively, and in turn connected to other components of the computing device 300. Specifically, the input device 301 receives input information from outside and transmits the input information to the central processing unit 303 through the input interface 302. The central processing unit 303 processes the input information based on computer-executable instructions stored in the memory 304 to generate output information. The output information is temporarily or permanently stored in the memory 304, and then the output information is transmitted to the output device 306 through the output interface 305. The output device 306 outputs the output information to outside of the computing device 300 for use by a user.

That is, the computing device shown in FIG. 3 may also be implemented to include: a memory storing computer-executable instructions; and a processor configured to execute the computer-executable instructions to implement the method and apparatus for estimating remaining charging time as described with reference to FIG. 1 and FIG. 2.

In an embodiment, the computing device 300 shown in FIG. 3 may be implemented as a system for estimating remaining charging time. The system for estimating remaining charging time may include: a memory storing programs; and a processor configured to execute the programs stored in the memory to perform the method for estimating remaining charging time as described in the above embodiments.

According to an embodiment of the present disclosure, the process described above with reference to the flowchart may be implemented as a computer software program. For example, according to embodiments of the present disclosure, a computer program product is provided. The computer program product includes computer programs tangibly embodied on a machine-readable medium. The computer programs contain program codes for performing the method as shown in a flowchart. In such embodiment, the computer programs may be downloaded and installed from a network, and/or installed from a removable storage medium.

In the above embodiments, it may be implemented in whole or in part by software, hardware, firmware, or any combination thereof. When implemented in software, it may be implemented in whole or in part in the form of a computer program product. The computer program product includes one or more computer instructions that, when executed on a computer, cause the computer to perform the method described in the various embodiments described above. When the computer program instructions are loaded and executed on a computer, the processes or functions according to the embodiments of the present disclosure are wholly or partially generated. The computer may be a general-purpose computer, a special-purpose computer, a computer network, or other programmable devices. The computer instructions may be stored in a computer-readable storage medium or transmitted from one computer-readable storage medium to another computer-readable storage medium, for example, the computer instructions may be transmitted from a website site, a computer, a server, or a data center to another website site, another computer, another server, or another data center via wired (such as coaxial cable, fiber optic, digital subscriber line (DSL)) or wireless (such as infrared, wireless, microwave, etc.) communication. The computer-readable storage medium may be any available medium that can be accessed by a computer or a data storage device such as a server, a data center, and the like that includes one or more available media. The available medium may be a magnetic medium (for example, a floppy disk, a hard disk, a magnetic tape), an optical medium (for example, a DVD), or a semiconductor medium (for example, a solid state disk).

The device embodiment described above is only schematic. A unit described as a separate component may or may not be physically separated, and a component shown as a unit may or may not be a physical unit, that is, may be located at one place, or may be distributed across multiple network elements. Some or all of the modules may be selected according to actual needs to achieve an objective of a solution of an embodiment. Those of ordinary skill in the art can understand and implement the embodiments without inventive efforts.

Finally, it should be noted that the above embodiments are only used to illustrate the technical solutions of the present disclosure, but not limited thereto. Although the present disclosure has been described in detail with reference to the foregoing embodiments, those skilled in the art should understand that: the technical solutions described in the foregoing embodiments may still be modified, or some or all of the technical features are equivalently replaced, and these modifications or replacements will not cause corresponding technical solutions depart from the scope of the technical solutions of embodiments of the present disclosure.

The invention claimed is:

1. A method for estimating remaining charging time, wherein, the method for estimating remaining charging time comprises:
   acquiring a state of charge estimation initial value and a temperature estimation initial value and determining a charging requested current value corresponding to the state of charge estimation initial value and a battery temperature change rate corresponding to the temperature estimation initial value;
   determining a state of charge estimation section corresponding to the state of charge estimation initial value and estimating a first estimated time required for a battery to be charged from the state of charge estimation initial value to an upper limit of the state of charge estimation section based on the charging requested current value;
   determining a temperature estimation section corresponding to the temperature estimation initial value, and estimating a second estimated time required for the battery to be changed in temperature from the temperature estimation initial value to an upper limit of the temperature estimation section based on the battery temperature change rate;
   determining a new state of charge estimation initial value, a new state of charge estimation section, a new temperature estimation initial value and a new temperature estimation section based on a smaller estimated time between the first estimated time and the second estimated time, until an upper limit of an state of charge estimation section reaches a target state of charge and a smaller estimated time is a first estimated time; and
   accumulating every determined smaller estimated times to obtain an estimated remaining charging time for the battery to be charged to the target state of charge.

2. The method for estimating remaining charging time according to claim 1, wherein the acquiring the state of charge estimation initial value and the temperature estimation initial value and determining the charging requested current value corresponding to the state of charge estimation initial value and the battery temperature change rate corresponding to the temperature estimation initial value comprises:
   determining the charging requested current value according to the state of charge estimation initial value and the temperature estimation initial value based on a predetermined first correspondence between a charging requested current and a state of charge as well as a temperature of the battery; and
   determining the battery temperature change rate according to the state of charge estimation initial value and the temperature estimation initial value based on a second correspondence between a battery temperature change rate and at least a state of charge as well as a temperature of the battery.

3. The method for estimating remaining charging time according to claim 2, wherein:
   the first correspondence comprises: a correspondence between a charging requested current and a state of charge as well as a temperature of the battery determined through a predetermined two dimensional lookup table for charging requested currents; and
   the second correspondence comprises: a correspondence between a battery temperature change rate and a state of charge as well as a temperature of the battery determined through a predetermined first lookup table for battery temperature change rates, or a correspondence between a battery temperature change rate and a state of charge as well as a temperature of the battery together with a heating and cooling power of a charging system determined through a predetermined second lookup table for battery temperature change rates.

4. The method for estimating remaining charging time according to claim 1, wherein the determining the state of charge estimation section corresponding to the state of charge estimation initial value and estimating the first estimated time required for the battery to be charged from the state of charge estimation initial value to the upper limit of the state of charge estimation section based on the charging requested current value comprises:
   determining a state of charge change section among a plurality of state of charge change sections based on the state of charge estimation initial value and an upper limit of a state of charge change section to which the state of charge estimation initial value belongs as the state of charge estimation section;
   correcting the charging requested current value by using an output current value of a charging device and determining a corrected actual charging current value corresponding to the state of charge estimation initial value; and
   estimating the first estimated time required for the battery to be charged from the state of charge estimation initial value to the upper limit of the state of charge estimation section based on the actual charging current value.

5. The method for estimating remaining charging time according to claim 4, wherein the correcting the charging requested current value by using the output current value of the charging device and determining the corrected actual charging current value corresponding to the state of charge estimation initial value comprises:

monitoring temperature and state of charge of the battery and an actual output current of the charging device corresponding to the monitored temperature and state of charge of the battery within a predetermined period of time after start of charging of the battery;

determining a charging requested current value corresponding to the monitored temperature and state of charge of the battery;

calculating a current value proportional relationship between the actual output current value of the charging device and the charging requested current value;

determining the actual charging current value corresponding to the state of charge estimation initial value by using the current value proportional relationship and the state of charge estimation initial value.

6. The method for estimating remaining charging time according to claim 1, wherein the determining the temperature estimation section corresponding to the temperature estimation initial value and estimating the second estimated time required for the battery to be changed in temperature from the temperature estimation initial value to the upper limit of the temperature estimation section based on the battery temperature change rate comprises:

determining a temperature change section among a plurality of temperature change sections for the battery as the temperature estimation section, wherein the temperature change section is determined based on the temperature estimation initial value and an upper limit of a temperature change section to which the temperature estimation initial value belongs; and estimating the second estimated time required for the battery to be changed in temperature from the temperature estimation initial value to the upper limit of the temperature estimation section based on the battery temperature change rate.

7. The method for estimating remaining charging time according to claim 1, wherein the determining the new state of charge estimation initial value, the new state of charge estimation section, the new temperature estimation initial value and the new temperature estimation section based on the smaller estimated time between the first estimated time and the second estimated time comprises:

when the smaller estimated time is the first estimated time:

determining a next state of charge change section being after the state of charge change section to which the state of charge estimation initial value belongs, as the new state of charge estimation section, wherein an initial value of the new state of charge estimation section is the new state of charge estimation initial value; and determining the upper limit of the temperature estimation section as an upper limit of the new temperature estimation section, and determining a temperature value obtained based on the first estimated time and the battery temperature change rate as the new temperature estimation initial value, so as to determine the new temperature estimation section.

8. The method for estimating remaining charging time according to claim 1, wherein the determining the new state of charge estimation initial value, the new state of charge estimation section, the new temperature estimation initial value and the new temperature estimation section based on the smaller estimated time between the first estimated time and the second estimated time comprises:

when the smaller estimated time is the second estimated time:

determining the upper limit of the state of charge estimation section as an upper limit of the new state of charge estimation section, and determining a state of charge obtained based on the second estimated time and the charging requested current value as the new state of charge estimation initial value, so as to determine the new state of charge estimation section; and determining a next temperature change section being after a temperature change section to which the temperature estimation initial value belongs, as the new temperature estimation section, and determining an initial value of the new temperature estimation section as the new temperature estimation initial value.

9. The method for estimating remaining charging time according to claim 1, wherein the determining the temperature estimation section corresponding to the temperature estimation initial value comprises:

correcting the charging requested current value by using an output current value of a charging device and determining a corrected actual charging current value corresponding to the state of charge estimation initial value;

calculating a battery temperature change rate and a battery temperature value at a next time point during the charging corresponding to the actual charging current value by using a calculation equation corresponding to energy conservation based on the actual charging current value, parameters of the battery and parameters of a charging system; and determining the battery temperature value at the next time point as the upper limit of the temperature estimation section, and determining the temperature estimation section based on the temperature estimation initial value and the upper limit of the temperature estimation section.

10. The method for estimating remaining charging time according to claim 9, wherein, the method for estimating remaining charging time further comprises:

performing an integration operation in time domain based on the temperature estimation initial value and the actual charging current value, and estimating the second estimated time required for the battery to be changed in temperature from the temperature estimation initial value to the upper limit of the temperature estimation section based on the integration operation.

11. The method for estimating remaining charging time according to claim 10, wherein the determining the new state of charge estimation initial value, the new state of charge estimation section, the new temperature estimation initial value and the new temperature estimation section based on the smaller estimated time between the first estimated time and the second estimated time comprises:

when the smaller estimated time is the first estimated time:

determining a next state of charge change section being after a state of charge change section to which state of charge estimation initial value belongs, as the new state of charge estimation section, determining the upper limit of the temperature estimation section as an upper limit of the new temperature estimation section, and determining a temperature value of the battery at the first estimated time during the integration operation as the new temperature estimation initial value, so as to determine the new temperature estimation section.

12. The method for estimating remaining charging time according to claim 10, wherein the determining the new state of charge estimation initial value, the new state of charge estimation section, and the new temperature estimation initial value and the new temperature estimation section based on the smaller estimated time between the first estimated time and the second estimated time comprises:

when the smaller estimated time is the second estimated time:

determining the upper limit of the state of charge estimation section as an upper limit of the new state of charge estimation section, and determining a state of charge obtained based on the second estimated time and the charging requested current value as the new state of charge estimation initial value, so as to determine the new state of charge estimation section; and determining a next temperature change section among a plurality of temperature change sections for the battery being after a temperature change section to which the temperature estimation initial value belongs, as the new temperature estimation section, and determining an initial value of the new temperature estimation section as the new temperature estimation initial value.

13. A non-transitory computer-readable storage medium, wherein the non-transitory computer-readable storage medium stores instructions that, when executed on a computer, cause the computer to perform a method for estimating remaining charging time according to claim 1.

14. A system for estimating remaining charging time, comprising a memory and a processor;

wherein the memory is configured to store executable program codes; and the processor is configured to read the executable program codes stored in the memory to perform a method for estimating remaining charging time according to claim 1.

* * * * *